(12) United States Patent
Seo

(10) Patent No.: US 9,602,112 B2
(45) Date of Patent: Mar. 21, 2017

(54) CLOCK DELAY DETECTING CIRCUIT AND SEMICONDUCTOR APPARATUS USING THE SAME

(71) Applicant: SK hynix Inc., Incheon-si, Gyeonggi-do (KR)

(72) Inventor: Young Suk Seo, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/735,957

(22) Filed: Jun. 10, 2015

(65) Prior Publication Data

US 2015/0280721 A1  Oct. 1, 2015

Related U.S. Application Data

(62) Division of application No. 14/040,829, filed on Sep. 30, 2013, now abandoned.

(30) Foreign Application Priority Data

Jul. 11, 2013 (KR) ........................ 10-2013-0081562

(51) Int. Cl.
*H03L 7/06* (2006.01)
*H03L 7/085* (2006.01)
*H03L 7/081* (2006.01)

(52) U.S. Cl.
CPC ............... *H03L 7/085* (2013.01); *H03L 7/06* (2013.01); *H03L 7/0812* (2013.01); *H03L 7/0816* (2013.01)

(58) Field of Classification Search
CPC .......... G11C 7/22; G11C 7/222; G11C 7/1051; G11C 7/1066
See application file for complete search history.

(56) References Cited

U.S. PATENT DOCUMENTS

| | | | |
|---|---|---|---|
| 2007/0046348 A1* | 3/2007 | Liu | H03L 7/0814 327/158 |
| 2007/0263460 A1* | 11/2007 | Jang | G11C 7/02 365/194 |
| 2009/0016128 A1* | 1/2009 | Hirano | G11C 7/1018 365/194 |

\* cited by examiner

*Primary Examiner* — Sibin Chen
(74) *Attorney, Agent, or Firm* — William Park & Associates Ltd.

(57) ABSTRACT

Provided is a clock delay detecting circuit and semiconductor apparatus using the same that is capable of generating a period signal whose period is a delay time of a clock, dividing the period signal, and counting the divided period signal. The clock delay detection circuit comprises a period signal generating unit configured to generate a counting control signal, a period signal dividing unit configured to generate a counting enable signal by dividing the counting control signal, and a counting unit configured to generate a delay information signal by counting the counting enable signal with a clock, wherein the counting control signal has a period with a predetermined time.

14 Claims, 6 Drawing Sheets

413

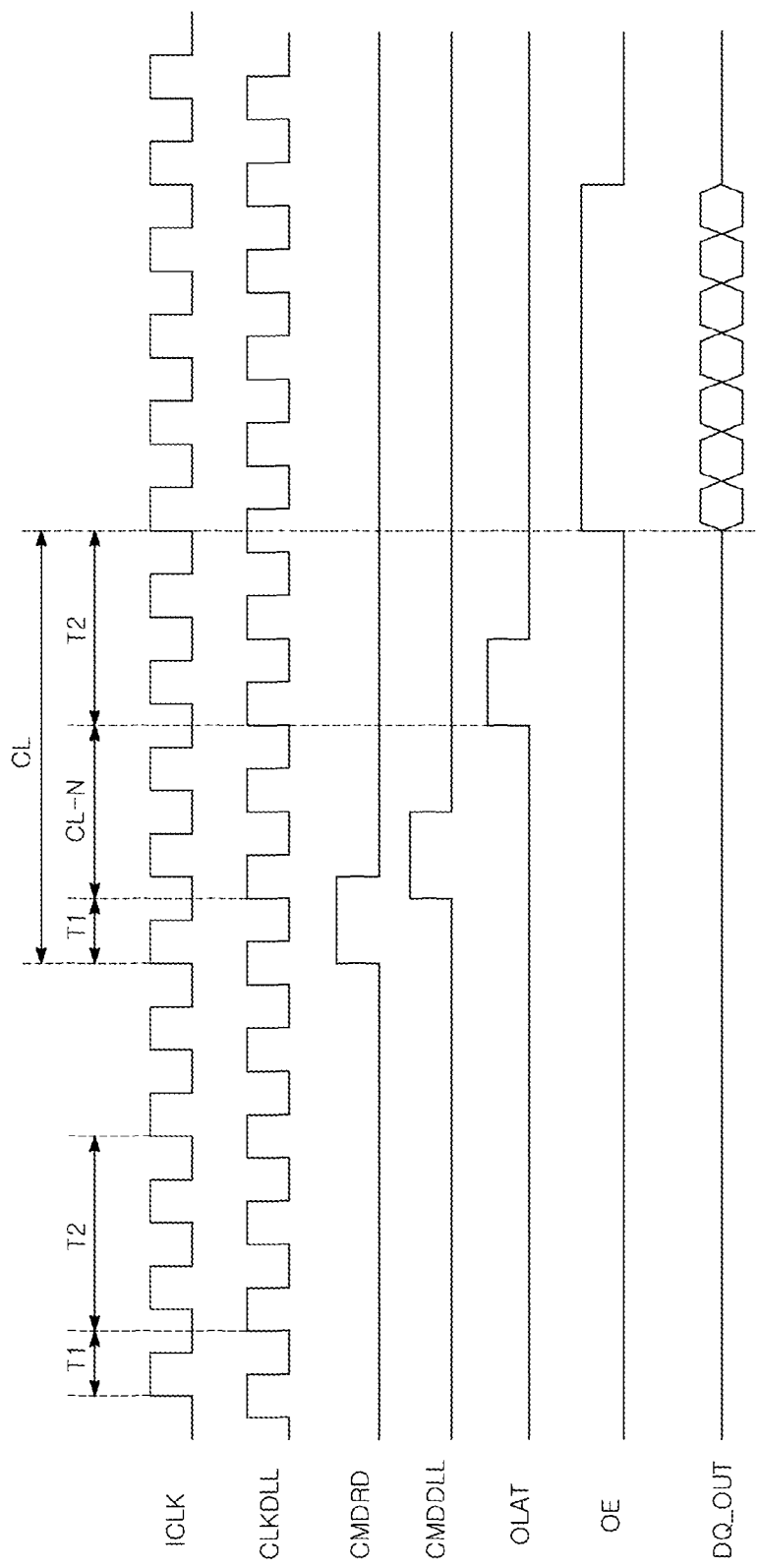

CLOCK DELAY DETECTING CIRCUIT AND SEMICONDUCTOR APPARATUS USING THE SAME

CROSS-REFERENCES TO RELATED APPLICATION

The present application claims priority under 35 U.S.C. §119(a) from Korean application number 10-2013-0081562, which was filed on Jul. 11, 2013 in the Korean Intellectual Property Office and is incorporated herein by reference in its entirety.

BACKGROUND

1. Technical Field

Various embodiments relate to a semiconductor apparatus, and more particularly, to a semiconductor apparatus that operates in synchronization with a clock.

2. Related Art

A semiconductor apparatus works in synchronization with a clock. For example, a memory device receives a clock from a host or a controller for communication with the host or the controller. The memory device receives or outputs data and signals synchronized with the clock.

The memory device has a circuit that compensates for the delay that the clock received from the host or the controller experiences in the device due to the internal circuits of the device. A delay-locked loop and a phase-locked loop are examples of the compensation circuit.

FIG. 1 is a block diagram of a semiconductor apparatus 10 unlike that of the present invention. As shown in FIG. 1, the semiconductor apparatus 10 includes a delay-locked loop circuit 11 and a clock delay detection circuit 12. The delay-locked loop circuit 11 receives an input clock ICLK to generate a delay clock CLKDLL. The delay-locked loop circuit 11 performs a delay-lock operation to compensate for the delay of the input clock ICLK in the semiconductor apparatus 10. The delay-locked loop circuit 11 generates a delay-lock completion signal DLLLOCK when the delay-lock operation is complete.

The clock delay detection circuit 12 receives the delay-lock completion signal DLLLOCK and the delay clock CLKDLL. With the delay-lock completion signal DLLLOCK enabled, the clock delay detection circuit 12 detects the amount of delay caused by internal circuits of the semiconductor apparatus 10 and the delay-locked loop circuit 11 and outputs the detected result N. The detected result N may be used for synchronization of a predetermined signal from the semiconductor apparatus 10 with an external clock. The predetermined signal is output from the semiconductor apparatus 10 to an external device in communication with the semiconductor apparatus 10.

SUMMARY

A clock delay detecting circuit and semiconductor apparatus using the same in accordance with an embodiment of the present invention are described herein. The clock delay detecting circuit is capable of generating a period signal whose period is the delay time of a clock, dividing the period signal, and counting the divided period signal.

In an embodiment of the present invention, a clock delay detection circuit comprises a period signal generating unit configured to generate a counting control signal, a period signal dividing unit configured to generate a counting enable signal by dividing the counting control signal, and a counting unit configured to generate a delay information signal by counting the counting enable signal with a clock, wherein the counting control signal has a period with a predetermined time.

In an embodiment of the present invention, a clock delay detection circuit comprises a counting control unit configured to generate a counting control signal and a counting enable signal based on the counting control signal, a first delay unit configured to delay the counting control signal and to generate a first delay signal, and a counting unit configured to generate a delay information signal by counting the counting enable signal with a clock, wherein the counting control signal has a period with a predetermined time.

In an embodiment of the present invention, a semiconductor apparatus comprises a delay-locked loop unit configured to delay an input clock and to generate a delay clock, a counting control unit configured to generate a counting control signal and a counting enable signal based on the counting control signal, the counting enable signal being enabled with a duration longer than a predetermined time, a command delay line configured to delay the counting control signal and to generate a delay command signal, a counting unit configured to generate a delay information signal by counting the counting enable signal with the delay clock, and an output control unit configured to generate an output control signal by delaying the delay command signal based on the delay information signal and a latency.

In an embodiment of the present invention, a clock delay detection circuit includes: a period signal generating unit configured to generate an oscillating signal; a period signal dividing unit configured to receive the oscillating signal to generate a counting enable signal; and a counting unit configured to receive the counting enable signal and a clock and generate a delay information signal.

BRIEF DESCRIPTION OF THE DRAWINGS

Features, aspects, and embodiments are described in conjunction with the attached drawings, in which:

FIG. 8 is a timing diagram illustrating the operation of a semiconductor apparatus according to an embodiment of the present invention.

DETAILED DESCRIPTION

Figure 1:
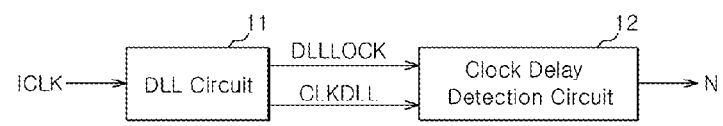
FIG. 1 is a block diagram illustrating a semiconductor apparatus 10 unlike that of the present invention.

Various embodiments will be described below in greater detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
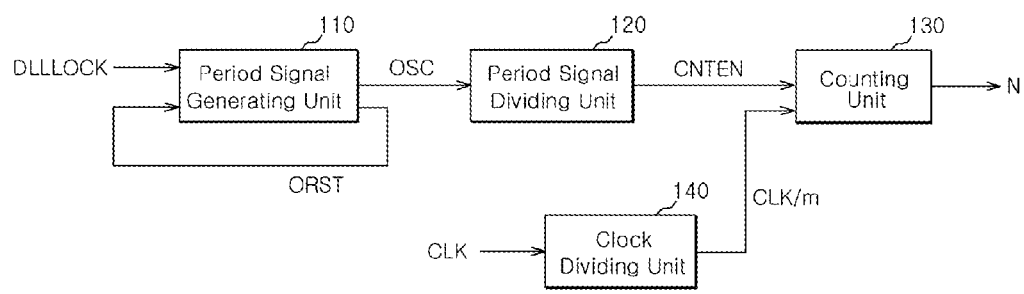
FIG. 2 is a block diagram illustrating a clock delay detection circuit 1 according to an embodiment of the present invention.

As shown in FIG. 2, the clock delay detection circuit 1 may include a period signal generating unit 110, a period signal dividing unit 120, and a counting unit 130.

The period signal generating unit 110 may generate a counting control signal OSC in response to a count start signal DLLLOCK. The counting control signal OSC may have a period, half of which is a predetermined time. The period signal generating unit 110 may generate an oscillating signal, half of whose period is the predetermined time. As disclosed below, it is preferable that the predetermined time is n multiplied by the period of the clock, wherein n is an integer greater than 1.

The period signal dividing unit 120 may receive the counting control signal OSC. The period signal dividing unit 120 may generate a counting enable signal CNTEN by dividing the counting control signal OSC. The period signal dividing unit 120 may generate the counting enable signal CNTEN by dividing the counting control signal OSC by m, wherein m is an integer greater than 2. Therefore, the counting enable signal CNTEN may be enabled with a duration of twice as long as the predetermined time.

The counting unit 130 may receive the counting enable signal CNTEN and a clock CLK. The counting unit 130 may generate a delay information signal N by counting the counting enable signal CNTEN with the clock CLK. The counting unit 130 may count the enabled duration of the counting enable signal CNTEN by means of the clock CLK and output the delay information signal N as the result of the counting. The delay information signal N may be a code signal having information about the counted number.

The clock delay detection circuit 1 may further include a clock dividing unit 140. The clock dividing unit 140 may divide the clock CLK so as to generate a divided clock CLK/m. The clock dividing unit 140 may generate the divided clock CLK/m by dividing the clock CLK by m, wherein m is an integer greater than 2. The division ratio of the period signal dividing unit 120 for the counting control signal OSC may be the same as that of the clock dividing unit 140 for the clock CLK.

When the clock CLK is delayed for the predetermined time, the clock delay detection circuit 1 disclosed above may detect with precision how many repetitions of the clock CLK correspond to the predetermined time. The clock delay detection circuit 1 may detect with precision the delay amount of the clock CLK with the period signal dividing unit 120 and the clock dividing unit 140.

Figure 3:
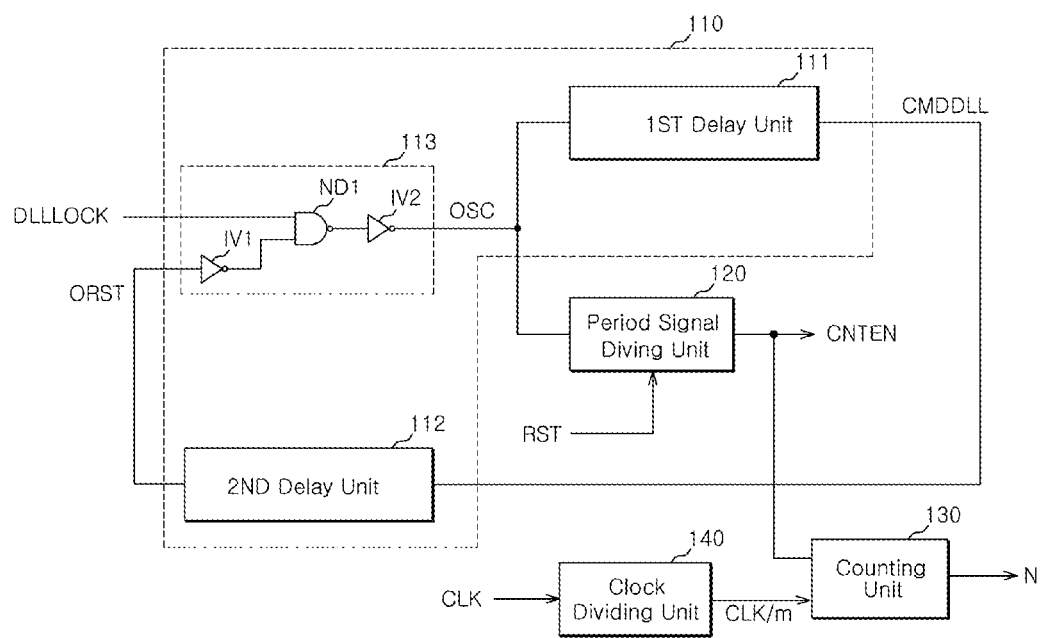
FIG. 3 is a detailed block diagram illustrating the clock delay detection circuit 1 of FIG. 2.

FIG. 3 is a detailed block diagram illustrating the clock delay detection circuit 1 of FIG. 2. As shown in FIG. 3, the period signal generating unit 110 may include a first delay unit 111 and a second delay unit 112. The first delay unit 111 may delay the counting control signal OSC with the amount of a first delay time to generate a first delay signal CMDDLL.

The second delay unit 112 may delay the first delay signal CMDDLL with the amount of a second delay time to generate a second delay signal ORST. The sum of the first delay time and the second delay time may be same as the predetermined time, and thus correspond to n multiplied by the clock CLK.

The period signal generating unit 110 may generate the counting control signal OSC, which oscillates with a period corresponding to double the predetermined time, with the first delay unit 111 and the second delay unit 112.

The period signal generating unit 110 may further include a triggering unit 113. The triggering unit 113 may receive the count start signal DLLLOCK and the second delay signal ORST and generate the counting control signal OSC. The second delay signal ORST may be a trigger control signal, since the second delay signal ORST is the inverse of the counting control signal OSC.

The triggering unit 113 may include a first inverter IV1, a first NAND gate ND1, and a second inverter IV2. The first inverter IV1 may invert the second delay signal ORST or the trigger control signal. The first NAND gate ND1 may receive the output of the first inverter IV1 and the count start signal DLLLOCK. The second inverter IV2 may invert the output of the first NAND gate ND1 and generate the counting control signal OSC. The triggering unit 113 may output the counting control signal OSC at a logic high level when the count start signal DLLLOCK is enabled at a logic high level. The triggering unit 113 may output the counting control signal OSC at a logic low level when the second delay signal ORST is at a logic high level after the counting control signal OSC of logic high level experiences a delay due to the first delay unit 111 and the second delay unit 112.

The period signal dividing unit 120 may generate a counting enable signal CNTEN by dividing the counting control signal OSC by m, and may be reset in response to a reset signal RST. The period signal dividing unit 120 and the clock dividing unit 140 may use a known dividing circuit. The counting unit 130 may use a known counting circuit.

Figure 4:
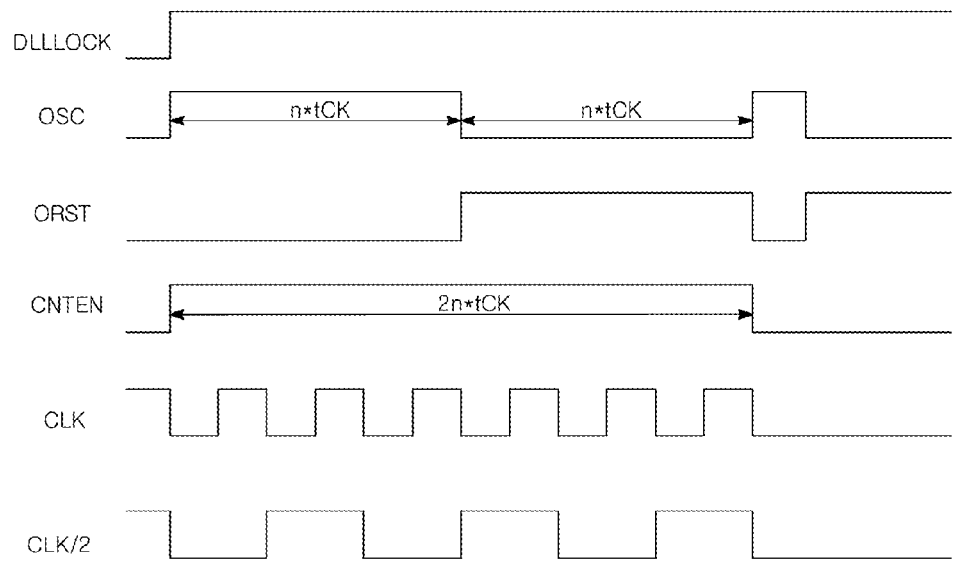
FIG. 4 is a timing diagram illustrating the operation of the clock delay detection circuit 1 according to an embodiment of the present invention.

FIG. 4 is a timing diagram illustrating the operation of a clock delay detection circuit 1 according to an embodiment. As shown in FIGS. 2 to 4, when the count start signal DLLLOCK is enabled at a logic high level, the period signal generating unit 110 may generate the counting control signal OSC oscillating with a period corresponding to double the predetermined time (n*tCK).

The triggering unit 113 may output the counting control signal OSC at a logic high level when the count start signal DLLLOCK is enabled at a logic high level. The triggering unit 113 may output the counting control signal OSC at a logic low level in response to the second delay signal ORST when the second delay signal ORST is at a logic high level after the counting control signal OSC experiences a delay due to the first delay unit 111 and the second delay unit 112.

The period signal dividing unit 120 may receive the counting control signal OSC, divide the counting control signal OSC by 2, and generate the counting enable signal CNTEN. FIG. 4 illustrates an example where the period signal dividing unit 120 and the clock dividing unit 140 divide each of the counting control signal OSC and the clock CLK by 2. Therefore, the counting enable signal CNTEN may be enabled with a duration of twice (2n*tCK) as much as the predetermined time (n*tCK). Also, the counting enable signal CNTEN may be enabled with a duration of 2n multiplied by as much as the clock CLK, since the predetermined time may be n multiplied by the clock CLK. Disablement of the counting enable signal CNTEN may lead to stoppage of oscillation of the counting control signal OSC, and thus oscillation of the second delay signal ORST.

The clock dividing unit 140 may generate the divided clock CLK/2 by dividing the clock CLK by 2. The counting unit 130 may count the enabled duration of the counting enable signal CNTEN by means of the divided clock CLK/2 and output the delay information signal N as the result of the counting.

For example, the counting unit 130 may count the level of the counting enable signal CNTEN at the rising edge of the divided clock CLK/2. For example as illustrated in FIG. 4, the counting unit 130 may output the delay information signal N as a code signal containing as information the number 3 or the counted number, since there are 3 rising edges of the divided clock CLK/2 in the enabled duration of the counting enable signal CNTEN.

Figure 5:
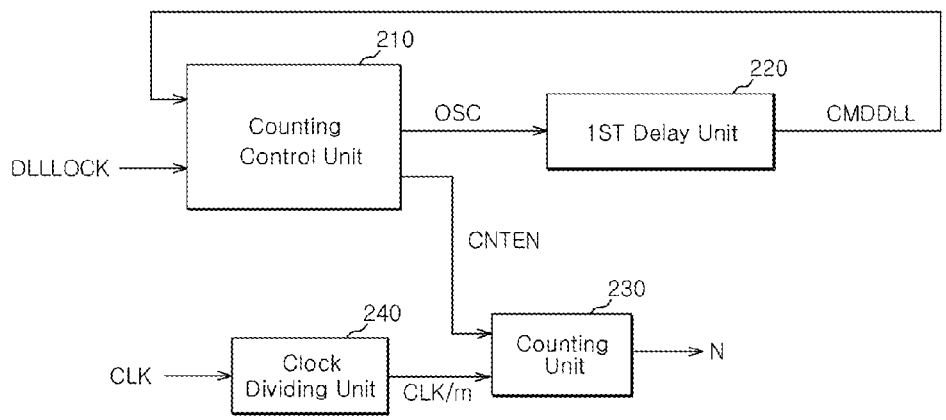
FIG. 5 is a block diagram illustrating the clock delay detection circuit 2 according to an embodiment of the present invention.

FIG. 5 is a block diagram illustrating a clock delay detection circuit 2 according to an embodiment of the present invention. As shown in FIG. 5, the clock delay detection circuit 2 may include a counting control unit 210, a first delay unit 220, and a counting unit 230.

The counting control unit 210 may generate the counting control signal OSC in response to the count start signal DLLLOCK and the first delay signal CMDDLL. The counting control signal OSC may have a period, half of which is the predetermined time. The counting control unit 210 may generate the counting enable signal CNTEN based on the counting control signal OSC. The first delay unit 220 may delay the counting control signal OSC to generate the first delay signal CMDDLL. The counting unit 230 may generate the delay information signal N by counting the counting enable signal CNTEN with the clock CLK.

The clock delay detection circuit 2 may further include a clock dividing unit 240. The clock dividing unit 240 may divide the clock CLK by m to generate a divided clock CLK/m.

The counting unit 230 may count the enabled duration of the counting enable signal CNTEN by means of the divided clock CLK/m and output the delay information signal N as the result of the counting.

The clock delay detection circuit 2 may be the same as the clock delay detection circuit 1. The counting control unit 210 may include the triggering unit 113, the period signal dividing unit 120 and the second delay unit 112. The operation of the clock delay detection circuit 2 may be the same as that of the clock delay detection circuit 1 illustrated in FIG. 4.

Figure 6:
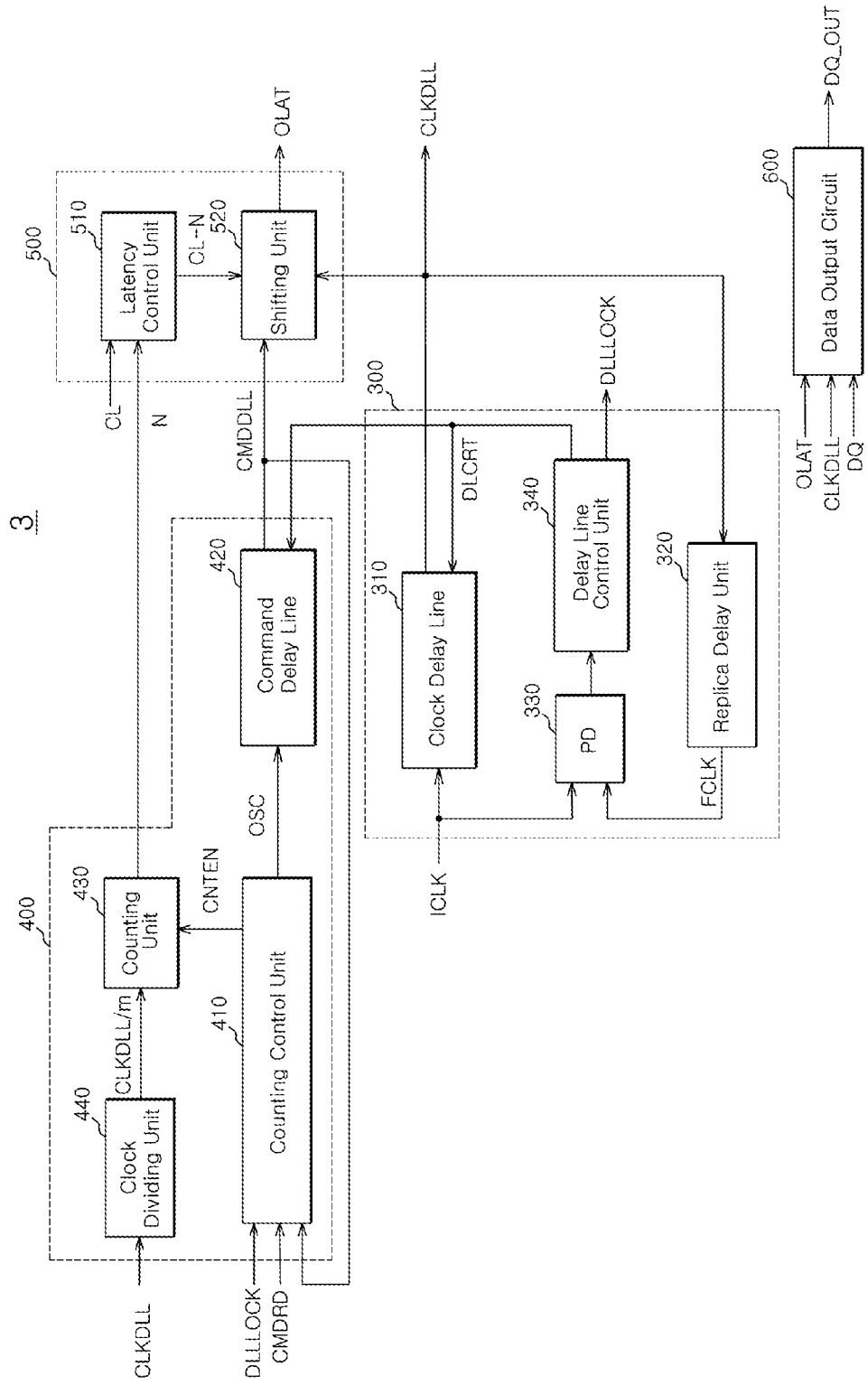
FIG. 6 is a block diagram illustrating a semiconductor apparatus 3 according to an embodiment of the present invention.

FIG. 6 is a block diagram illustrating a semiconductor apparatus 3 according to an embodiment. As shown in FIG. 6, the semiconductor apparatus 3 may include a delay-locked loop circuit 300, a clock delay detection circuit 400, and an output control circuit 500.

The delay-locked loop circuit 300 may delay an input clock ICLK and generate a delay clock CLKDLL. The delay-locked loop circuit 300 may delay the input clock ICLK to compensate for the delay of an external clock in internal circuits (not illustrated) of the semiconductor apparatus 3. The input clock ICLK may be an external clock that is buffered.

The delay-locked loop circuit 300 may include a clock delay line 310, a replica delay unit 320, a phase detection unit 330, and a delay line control unit 340. The clock delay line 310 may delay the input clock ICLK with the amount of a first delay time to generate the delay clock CLKDLL. The replica delay unit 320 may delay the delay clock CLKDLL with a predetermined amount of delay to generate a feedback clock FCLK. The predetermined amount of delay of the replica delay unit 320 may represent the delay of the external clock in the internal circuits of the semiconductor apparatus 3. The phase detection unit 330 may compare the phase of the input clock ICLK with the phase of the feedback clock FCLK. The delay line control unit 340 may generate a delay line control signal DLCRT based on the result of the phase comparison of the input clock ICLK with the feedback clock FCLK and output the delay line control signal DLCRT to the clock delay line 310. The delay amount of the clock delay line 310 may vary according to the delay line control signal DLCRT.

The delay line control unit 340 may generate a delay-lock completion signal DLLLOCK when the phase of the input clock ICLK and the phase of the feedback clock FCLK are identical to each other. The delay-locked loop circuit 300 may delay the input clock ICLK with the amount of the first delay time to generate the delay clock CLKDLL. The first delay time may correspond to the time of the delay of the replica delay unit 320 subtracted from multiples of the input clock ICLK.

The delay of the replica delay unit 320 may be a second delay time. The delay-locked loop circuit 300 may generate the delay clock CLKDLL, which is a delayed version of the input clock ICLK delayed with the amount of the first delay time. The delay clock CLKDLL may be synchronized with the external clock through delay with the amount of the second delay time by internal circuits of the semiconductor apparatus 3.

The clock delay detection circuit 400 may include a counting control unit 410, a command delay line 420, and a counting unit 430. The clock delay detection circuit 400 may be the same as the clock delay detection circuit 2 illustrated in FIG. 5.

The counting control unit 410 may generate the counting control signal OSC in response to the delay-lock completion signal DLLLOCK and a delay command signal CMDDLL. The counting control unit 410 may generate the counting enable signal CNTEN based on the counting control signal OSC. The counting enable signal CNTEN may be enabled with a duration twice as long as the predetermined time.

The counting control unit 410 may receive the delay-lock completion signal DLLLOCK as the count start signal. Also, the counting control unit 410 may receive a data output command signal CMDRD. The counting control unit 410 may output the data output command signal CMDRD as the counting control signal OSC in response to the delay-lock completion signal DLLLOCK, representing completion of detection of the clock delay.

The command delay line 420 may delay the counting control signal OSC to generate the delay command signal CMDDLL. The command delay line 420 may receive the delay line control signal DLCRT, generated by the delay line control unit 340. The delay line control unit 340 may also output the delay line control signal DLCRT to the clock delay line 310.

The command delay line 420 may be the same as the clock delay line 310. The command delay line 420 may delay the counting control signal OSC with the amount of a first delay time to generate the delay command signal CMDDLL. The command delay line 420 may be the same as the first delay unit 220, illustrated in FIG. 5.

The counting unit 430 may generate the delay information signal N by counting the counting enable signal CNTEN with the delay clock CLKDLL.

The clock delay detection circuit 400 may further include a clock dividing unit 440. The clock dividing unit 440 may divide the delay clock CLKDLL by m to generate a divided clock CLKDLL/m. The counting unit 430 may count the enabled duration of the counting enable signal CNTEN by means of the divided clock CLKDLL/m and output the delay information signal N as the result of the counting.

The output control circuit 500 may include a latency control unit 510 and a shifting unit 520. The latency control unit 510 may receive a latency CL and the delay information signal N. The latency CL may be provided as a code signal. The latency control unit 510 may generate a corrected latency CL-N based on the latency CL and the delay information signal N. The latency control unit 510 may generate the corrected latency CL-N by subtracting a code value corresponding to the delay information signal N from the latency CL. The latency CL may define a time from an input time to an output time when a read command is input to the semiconductor apparatus 3 from a host or a controller communicating with the semiconductor apparatus 3; wherein the input time is the time of input of the read command to the semiconductor apparatus 3 and the output time is the time of output of data from the semiconductor apparatus 3. The latency may be required for communication between the semiconductor apparatus 3 and the host or the controller.

The shifting unit 520 may receive the corrected latency CL-N and the delay command signal CMDDLL to generate an output control signal OLAT. The shifting unit 520 may receive the delay clock CLKDLL, delay the delay clock CLKDLL by multiples of the delay clock CLKDLL, where the multiples correspond to the corrected latency CL-N, and generate the output control signal OLAT. The delay amount of the shifting unit 520 may depend on the corrected latency CL-N.

The semiconductor apparatus 3 may further include a data output circuit 600. The data output circuit 600 may receive the delay clock CLKDLL, the output control signal OLAT, and internal data DQ to output data DQ_OUT. The data output circuit 600 may be an internal circuit of the semiconductor apparatus 3. The data output circuit 600 may output the internal data DQ as the data DQ_OUT based on the delay clock CLKDLL and the output control signal OLAT. The delay clock CLKDLL and the output control signal OLAT may be delayed with the amount of the second delay time in the data output circuit 600. The data DQ_OUT may be synchronized with the external clock.

Figure 7:
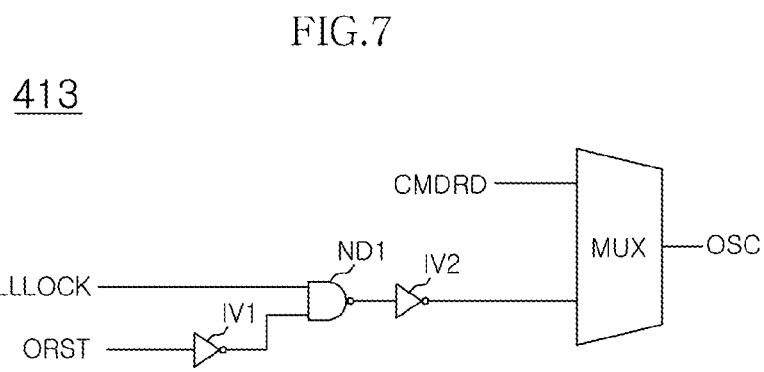
FIG. 7 is a block diagram illustrating a triggering unit 413 of the counting control unit 410 shown in FIG. 6.

FIG. 7 is a block diagram illustrating a triggering unit 413 of the counting control unit 410 shown in FIG. 6. As shown in FIG. 7, the triggering unit 413 may be the same as the triggering unit 113 of FIG. 3 including the first inverter IV1, the first NAND gate ND1, and the second inverter IV2.

The triggering unit 413 may further include a multiplexer MUX. The multiplexer MUX may output one of the data output command signal CMDRD and the output of the second inverter IV2. The multiplexer MUX may firstly output the count start signal DLLLOCK as the counting control signal OSC for generation of the delay information signal N.

After that, once the detection of clock delay is completed, the multiplexer MUX may output the data output command signal CMDRD as the counting control signal OSC for the data output operation of the semiconductor apparatus 3.

FIG. 8 is a timing diagram illustrating the operation of a semiconductor apparatus 3 according to an embodiment. As shown in FIGS. 6 to 8, the delay-locked loop circuit 300 may generate the delay clock CLKDLL by delaying the input clock ICLK by the amount of the first delay time T1. Once the delay lock operation is completed, the delay-lock completion signal DLLLOCK may be enabled at a HIGH level, and the clock delay detection circuit 400 may detect the number of repetitions of the input clock ICLK that corresponds to the predetermined time (T1+T2).

FIG. 8 shows an example wherein 3 repetitions of the input clock ICLK correspond to the predetermined time (T1+T2). Therefore, the delay information signal N may be output with a code value corresponding to number 3. After that, once the semiconductor apparatus 3 receives the data output command signal CMDRD from the host or the controller communicating with the semiconductor apparatus 3, the multiplexer MUX of the triggering unit 413 may output the data output command signal CMDRD.

The data output command signal CMDRD may be delayed by the amount of the first delay time T1 by the command delay line 420 and output as the delay command signal CMDDLL. The latency control unit 510 may generate the corrected latency CL-N based on the latency CL and the delay information signal N. The corrected latency CL-N may be a code value of 3 since FIG. 8 shows the example wherein the latency CL has a value of 6 and the delay information signal N has a value of 3.

The shifting unit 520 may delay the delay command signal CMDDLL with the amount of the corrected latency CL-N and generate the output control signal OLAT.

The data output circuit 600 may delay the output control signal OLAT with the amount of the second delay time T2 to change the output control signal OLAT to an output enable signal OE. The data DQ_OUT may be synchronized with the input clock ICLK and may be output to the host or the controller by the enabled output enable signal OE.

While certain embodiments have been described above, it will be understood to those skilled in the art that the embodiments described are by way of example only. Accordingly, the system and method described herein should not be limited based on the described embodiments. Rather, the system and method described herein should only be limited in light of the claims that follow when taken in conjunction with the above description and accompanying drawings.

What is claimed is:

1. A semiconductor apparatus comprising:
   a delay-locked loop unit configured to delay an input clock and to generate a delay clock;
   a counting control unit configured to generate a counting control signal and a counting enable signal based on the counting control signal, the counting enable signal being enabled with a duration longer than a sum of a first delay time and a second delay time;
   a command delay line configured to delay the counting control signal by the first delay time and to generate a delay command signal;
   a counting unit configured to generate a delay information signal by counting the counting enable signal with the delay clock; and
   an output control unit configured to generate an output control signal by delaying the delay command signal based on the delay information signal and a latency.

2. The semiconductor apparatus of claim 1, wherein the delay-locked loop unit includes a clock delay line configured to delay the input clock by the first delay time.

3. The semiconductor apparatus of claim 1, wherein the first delay time corresponds to a time interval of a delay that an external clock experiences in the semiconductor apparatus subtracted from n multiples of the input clock, n being greater than 1.

4. The semiconductor apparatus of claim 1, wherein the counting control unit includes:
   a replica delay unit configured to delay the delay command signal by the second delay time and to generate a trigger control signal;

a triggering unit configured to generate the counting control signal in response to a count start signal and the trigger control signal; and a period signal dividing unit configured to generate the counting enable signal by dividing the counting control signal.

5. The semiconductor apparatus of claim 1, wherein the output control unit includes:

a latency control unit configured to generate a corrected latency by subtracting a code value corresponding to the delay information signal from the latency; and a shifting unit configured to generate the output enable signal by delaying the command delay signal by multiples of a clock that correspond to the corrected latency.

6. A Semiconductor apparatus comprising:

a counting control unit configured to generate a counting control signal based on a delay lock completion signal, and generate a counting enable signal based on the counting control signal, the counting enable signal being enabled with a duration longer than a sum of a first delay time and a sum of a first delay time and a second delay time;

a counting unit configured to generate a delay information signal by counting the counting enable signal with a delay clock;

a command delay line configured to delay the counting control signal by the first delay time and to generate a delay command signal;

an output control unit configured to generate an output control signal by delaying the delay command signal based on the delay information signal and a latency.

7. The semiconductor memory apparatus of claim 6, further comprising:

a delay-locked loop unit configured to delay an input clock and to generate the delay clock and the delay lock completion signal.

8. The semiconductor memory apparatus of claim 7, wherein the delay-locked loop unit includes a clock delay line configured to delay the input clock by the first delay time.

9. The semiconductor memory apparatus of claim 8, wherein the first delay time corresponds to a time interval of a delay that an external clock experiences in the semiconductor apparatus subtracted from n multiples of the input clock, n being an integer greater than 1.

10. The semiconductor apparatus of claim 8, wherein the counting control unit includes:

a replica delay unit configured to delay the delay command signal by the second delay time and to generate a trigger control signal;

a triggering unit configured to generate the counting control signal in response to the delay lock completion signal and the trigger control signal; and a period signal dividing unit configured to generate the counting enable signal by dividing the counting control signal.

11. A Semiconductor apparatus comprising:

a counting control unit configured to generate a counting control signal, which oscillates with a period of time interval corresponding to first and second delay times that a sum of the first and second delay time is n times a period of clock, n being an integer greater than 1, based on a delay lock completion signal, and to enable a counting enable signal based on the counting control signal during m multiples of the first and second delay times, m being an integer greater than 2;

a counting unit configured to generate a delay information signal by counting the counting enable signal with a delay clock;

a command delay line configured to delay the counting control signal by the first delay time to generate a delay command signal;

an output control unit configured to generate an output control signal by delaying the delay command signal based on the delay information signal and a latency.

12. The semiconductor apparatus of claim 11, further comprising:

a delay-locked loop unit configured to delay an input clock by the first delay time to generate the delay clock and the delay lock completion signal.

13. The semiconductor apparatus of claim 12, wherein the first delay time corresponds to a time interval of a delay that an external clock experiences in the semiconductor apparatus subtracted from n multiples of the input clock, m being an integer greater than 1.

14. The semiconductor apparatus of claim 11, wherein the counting control unit includes:

a replica delay unit configured to delay the delay command signal by the second delay time and to generate a trigger control signal;

a triggering unit configured to generate the counting control signal in response to the delay lock completion signal and the trigger control signal; and a period signal dividing unit configured to generate the counting enable signal by dividing the counting control signal.

* * * * *